United States Patent
Wang et al.

(10) Patent No.: US 7,940,528 B2
(45) Date of Patent: May 10, 2011

(54) ELECTRONIC DEVICE AND HEAT SINK THEREOF

(75) Inventors: Feng-Ku Wang, Taipei (TW);
Ting-Chiang Huang, Taipei (TW);
Shaw-Fuu Wang, Taipei (TW);
Sheng-Jie Syu, Taipei (TW)

(73) Assignee: Inventec Corporation, Taipei (TW)

(*) Notice: Subject to any disclaimer, the term of this patent is extended or adjusted under 35 U.S.C. 154(b) by 85 days.

(21) Appl. No.: 12/539,182

(22) Filed: Aug. 11, 2009

(65) Prior Publication Data

US 2010/0053892 A1 Mar. 4, 2010

(30) Foreign Application Priority Data

Aug. 29, 2008 (TW) ................................ 97133178 A

(51) Int. Cl.
*H05K 7/20* (2006.01)
*G06F 1/20* (2006.01)

(52) U.S. Cl. .............. 361/710; 361/679.46; 361/679.54; 361/690; 361/692; 361/704; 361/709; 361/718; 165/80.2; 165/185; 174/16.3

(58) Field of Classification Search ............ 361/679.46, 361/679.54, 690, 692, 703–704, 709–710, 361/718; 165/80.2–80.3, 185; 174/16.3
See application file for complete search history.

(56) References Cited

U.S. PATENT DOCUMENTS

| 901,762 | A | * | 10/1908 | Wetzel | 446/297 |
| 1,652,777 | A | * | 12/1927 | Geisler | 446/346 |
| 1,763,903 | A | * | 6/1930 | Perkins | 446/273 |
| 1,988,657 | A | * | 1/1935 | Jones | 131/242 |
| 2,480,139 | A | * | 8/1949 | Keene | 431/146 |
| 2,700,246 | A | * | 1/1955 | Phistberg | 446/256 |
| 3,312,437 | A | * | 4/1967 | Barth | 248/158 |
| 5,795,078 | A | * | 8/1998 | Li | 384/498 |
| 6,217,408 | B1 | * | 4/2001 | Willinger | 446/396 |
| 7,717,613 | B1 | * | 5/2010 | Epps | 366/205 |
| 7,838,846 | B2 | * | 11/2010 | Pinsky | 250/455.11 |
| 2002/0111109 | A1 | * | 8/2002 | Kwan | 446/220 |

* cited by examiner

*Primary Examiner* — Robert J Hoffberg
(74) *Attorney, Agent, or Firm* — Rabin & Berdo, P.C.

(57) ABSTRACT

An electronic device includes a casing, a thermal generating element, and a heat sink. The thermal generating element is disposed within the casing and operates to produce thermal energy. The heat sink includes a thermal transfer plate and a plurality of movable thermal transfer members. The thermal transfer plate contacts the thermal generating element and includes a plurality of recesses. Each of the movable thermal transfer members has a weight end and a free end. The weight end is accommodated in the recess. The thermal energy produced by the thermal generating element is conducted to the movable thermal transfer members via the thermal transfer plate. When the casing is tilted by a certain angle, the movable thermal transfer member swings relative to the thermal transfer plate, such that the free end thereof points to a direction opposite to that of an acceleration of gravity under a normal state.

10 Claims, 8 Drawing Sheets

ELECTRONIC DEVICE AND HEAT SINK THEREOF

CROSS-REFERENCE TO RELATED APPLICATIONS

This non-provisional application claims priority under 35 U.S.C. §119(a) on Patent Application No(s). 097133178 filed in Taiwan, R.O.C. on Aug. 29, 2008 the entire contents of which are hereby incorporated by reference.

BACKGROUND OF THE INVENTION

1. Field of the Invention

The present invention relates to thermal dissipation of an electronic device, and more particularly to an electronic device with movable thermal transfer elements and a heat sink thereof.

2. Related Art

As the performance of various electronic products has been increasingly enhanced, the accompanying thermal dissipation problem becomes even serious, especially the thermal dissipation problem of portable electronic devices. As for a portable electronic device, such as a notebook computer, a handheld computer, a mobile Internet device (MID), an ultra mobile personal computer (UMPC), a casing thereof is designed under the principle of "being light, thin, short, and small", so as to maintain the chic and portable features. Correspondingly, the space inside the casing of the portable electronic device seems quite limited, such that electronic elements configured within the casing must be arranged in a quite compact manner. As a result, the thermal energy produced by the electronic elements due to a long-time operation is easily accumulated within the casing of the portable electronic device, such that the temperature of the entire portable electronic device rises sharply in a short time. Therefore, if the thermal energy in the casing of the portable electronic device cannot be eliminated rapidly in time, the electronic elements are easily resulted to work continuously in a high-temperature operating environment, which certainly influences the normal operation of the portable electronic device and even results in the damage of the electronic elements due to being overheated.

In order to improve the overall thermal dissipation efficiency of the system, most standard portable electronic device, e.g., a notebook computer, employs a heat sink component formed by combining a heat sink fin set with an electronic fan and a thermal transfer pipe to dissipate thermal energy. The heat sink fin set includes thermal transfer blocks and fins extended from the thermal transfer blocks. The thermal energy of a heat source is conducted to the fins via the thermal transfer blocks or the thermal transfer pipe. The electronic fan produces an airflow that passes through the fins to take away the thermal energy on the fins. However, as for a handheld electronic device with a smaller volume, e.g., the MID, since the inner space thereof is quite limited, in view of the factors that an inner heat source thereof produces less thermal, a fan configured therein may produce noises, and other problems, the handheld electronic device usually adopts merely a plate-shaped heat sink or adds fins on the heat sink, which is sufficient for meeting the thermal dissipation requirement of the system.

Recently, due to the continuous increasing of the chip processing clock, as well as other factors, the handheld electronic device has an increasingly high requirement for the thermal dissipation. However, the handheld electronic device still does not have sufficient inner space for disposing an electronic fan, but is merely configured with more fins. As a result, there is almost no gap between distal ends of the fins and the casing of the handheld electronic device. Therefore, without the assistance of the airflow, the thermal energy on the fins is directly conducted to the casing, such that the temperature of the casing rises continuously. The handheld electronic device is mainly provided for a user to operate while holding it in a palm and is seldom put on a desk for use, so that the excessively high temperature of the casing will result in less comfortableness of the user when holding it, thereby influencing the user's desire to purchase such handheld electronic device. In addition, the fins of the general heat sink fin set are vertically disposed on the thermal transfer blocks. However, the handheld electronic device is mostly used in a tilted state. Therefore, the hot air with a high temperature at the bottom of the fins cannot flow upward smoothly, such that the air convection around the fins is hindered, thereby reducing the thermal exchange efficiency of the heat sink fin set.

SUMMARY OF THE INVENTION

In view of the problems in the prior art that the temperature of a casing of a handheld electronic device is excessively high and a thermal exchange efficiency is rather poor during a tilted operation, the present invention is provided an electronic device and a heat sink thereof, so as to reduce the temperature of the casing of the handheld electronic device and to improve the thermal exchange efficiency.

In order to solve the above problems, the present invention provides an electronic device and a heat sink thereof. The electronic device includes a casing, a thermal generating element, and a heat sink. The thermal generating element is disposed within the casing and operates to produce thermal energy. The heat sink includes a thermal transfer plate and at least one movable thermal transfer member. The thermal transfer plate contacts the thermal generating element and has at least one recess and at least one retaining portion. Each of the movable thermal transfer members has a weight end and a free end. The weight end is accommodated in the recess and restricted in the recess by the retaining portion. The thermal energy produced by the thermal generating element is conducted to the movable thermal transfer members via the thermal transfer plate. A center of gravity of each of the movable thermal transfer members is located at the weight end. When the casing or the thermal transfer plate is tilted by a certain angle with respect to a horizontal plane, the center of gravity of the movable thermal transfer member is raised, the potential energy thereof is increased, and thus the movable thermal transfer member swings relative to the thermal transfer plate, such that the free end thereof points to a direction opposite to that of an acceleration of gravity under a normal state.

The present invention achieves the following efficacies. The movable thermal transfer members may swing on the thermal transfer plate through the weight ends thereof, and the center of gravity of each of the movable thermal transfer members is located at the weight end. Therefore, the movable thermal transfer members may swing accordingly as the casing is tilted with respect to the horizontal plane, such that the free end thereof points to the direction opposite to that of the acceleration of gravity at any time, so as to increase a distance between the free end and the casing. In this way, the thermal energy on the movable thermal transfer members cannot be directly conducted to the casing, thereby avoiding the excessively high temperature of the casing of the electronic device, and improving the thermal dissipation efficiency.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1:
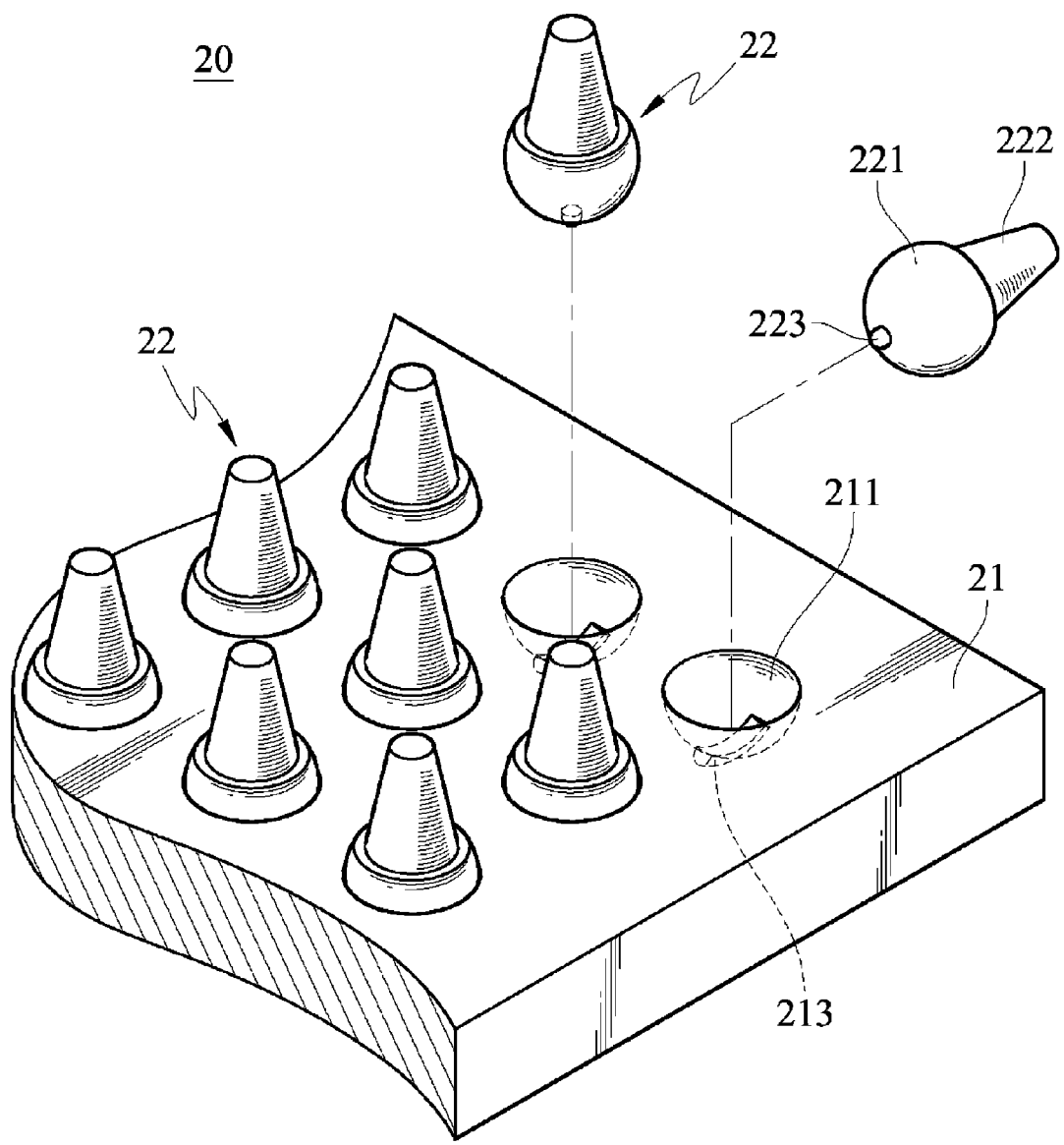
FIG. 1 is an exploded view of movable thermal transfer members and a thermal transfer plate according to a first embodiment of the present invention.

To make the objectives, structures, features, and functions of the present invention more comprehensible, the present invention is illustrated below in detail through the embodiments.

FIGS. 1 to 8 show an electronic device and a heat sink thereof according to a first embodiment of the present invention. The above electronic device substantially refers to a handheld electronic device, for example, a mobile Internet device (MID), an ultra mobile personal computer (UMPC), etc. Referring to FIGS. 1 to 8, the electronic device includes a casing 10, a circuit board 12, a thermal generating element 13, and a heat sink 20. The thermal generating element 13 is substantially a chip, for example, a central processing unit (CPU), or a display chip, electrically disposed on the circuit board 12. The thermal generating element 13 is disposed within the casing 10 through the circuit board 12 and operates by the power supplied from the circuit board 12 to produce thermal energy. The casing 10 is opened with a plurality of thermal dissipation holes 11 for air to come in and go out respectively at two ends thereof. Moreover, there is at least one thermal dissipation hole 11 respectively configured at each end of the casing 10, such that the air inside the casing 10 may perform convection with the outside air through the thermal dissipation holes 11.

Figure 2:
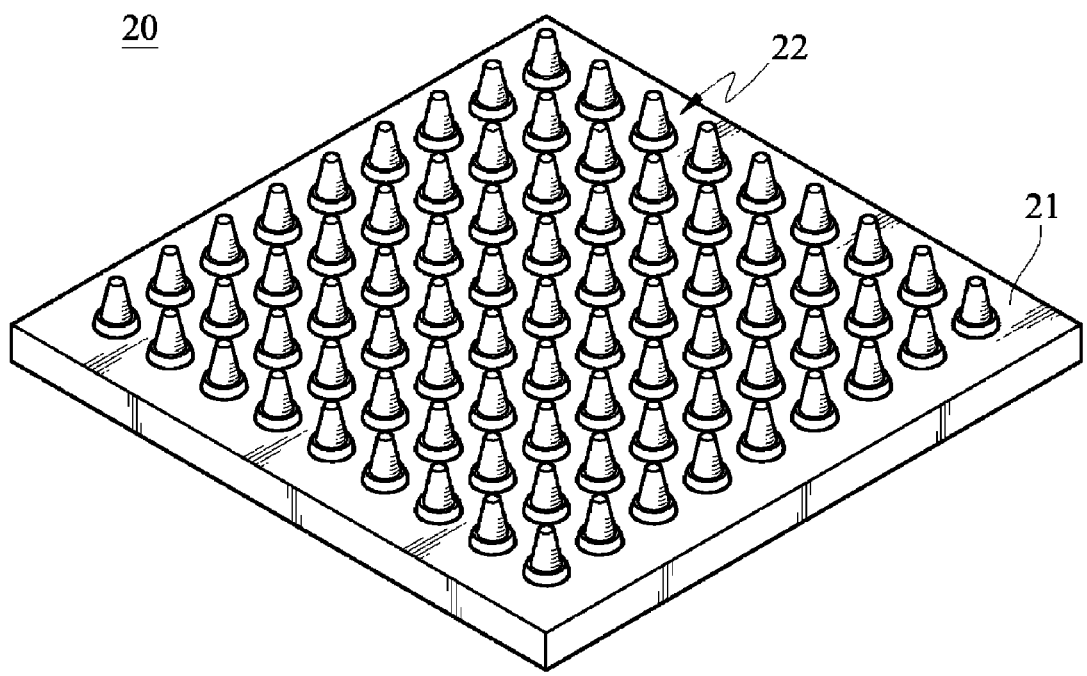
FIG. 2 is a schematic view of a heat sink according to the first embodiment of the present invention.
Figure 3:
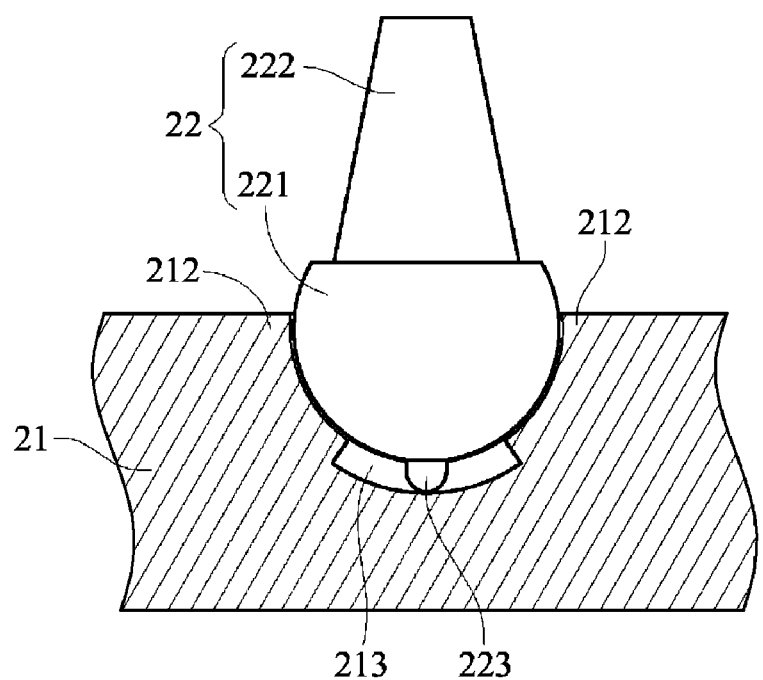
FIG. 3 is a partial cross-sectional view of the heat sink according to the first embodiment of the present invention.

Referring to FIGS. 1, 2, and 3, the heat sink 20 includes a thermal transfer plate 21 and a plurality of movable thermal transfer members 22. The number of the movable thermal transfer members 22 may be increased or decreased depending upon the actual demands, but there is at least one movable thermal transfer member 22. The thermal transfer plate 21 is made of a material with desirable thermal transfer efficiency, for example, aluminum, copper, and other metals. The thermal transfer plate 21 is fixed on the thermal generating element 13, such that one side surface thereof contacts the thermal generating element 13 and the thermal energy produced by the thermal generating element 13 is directly conducted to the thermal transfer plate 21. The other side surface of the thermal transfer plate 21 opposite to the thermal generating element 13 is disposed with a plurality of recesses 211 and a plurality of retaining portions 212. The number of the recesses 211 corresponds to the actual number of the disposed movable thermal transfer members 22, and the number of the retaining portions 212 corresponds to that of the recesses 211. Each of the recesses 211 has a stopper trench 213 at a bottom end thereof. The stopper trenches 213 are disposed corresponding to the thermal dissipation holes 11 of the casing 10 in such a way that two ends of the stopper trenches 213 respectively point to the thermal dissipation holes 11 at two ends of the casing 10.

Each of the movable thermal transfer members 22 has a weight end 221 and a free end 222. The weight of the movable thermal transfer member 22 focuses on a bottom portion of the weight end 221 (far from the free end 222), such that a center of gravity of the movable thermal transfer member 22 is located in the weight end 221. The weight end 221 is accommodated in the recess 211 and is restricted in the recess 211 by the retaining portion 212. The thermal energy produced by the thermal generating element 13 is first conducted to the thermal transfer plate 21 and then conducted to the movable thermal transfer members 22 via the thermal transfer plate 21. The weight end 221 has a guide portion 223 at a bottom end thereof. The guide portion 223 slides in the stopper trench 213, such that the movable thermal transfer member 22 swings on the thermal transfer plate 21 along the stopper trench 213, thereby restricting a swing direction and a swing angle of the movable thermal transfer member 22. In this embodiment, each of the recesses 211 of the thermal transfer plate 21 is substantially a hemispherical recess, each of the retaining portions 212 is substantially an annular edge surrounding an opening of the hemispherical recess, and the weight end 221 is substantially a sphere. An aperture of the opening of the hemispherical recess (the recess 211) is larger than a diameter of the sphere (the weight end 221). As a result, the weight end 221 can still move within the recess 211 after being placed into the recess 211, such that the movable thermal transfer member 22 may swing relative to the thermal transfer plate 21, and the weight end 221 is restricted by the retaining portion 212, such that the movable thermal transfer member 22 does not fall off from the thermal transfer plate 21 during the swinging process.

Figure 4:
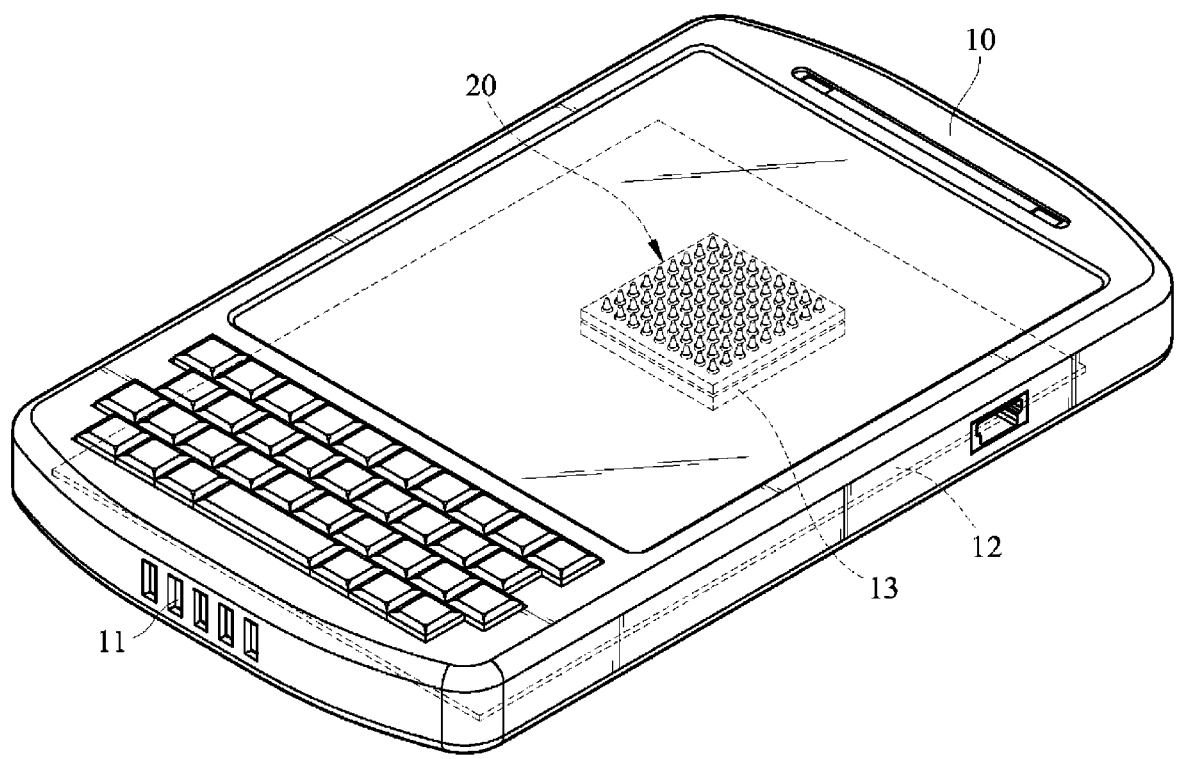
FIG. 4 is a schematic view of an electronic device according to the first embodiment of the present invention.
Figure 5:
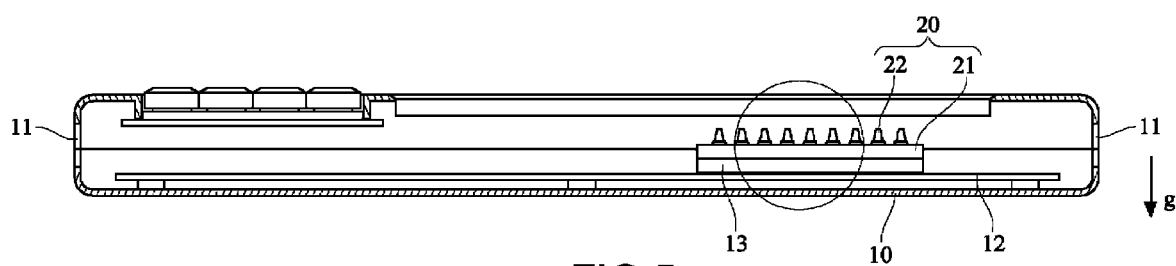
FIG. 5 is a cross-sectional view of the electronic device according to the first embodiment of the present invention, when being placed horizontally.
Figure 6:
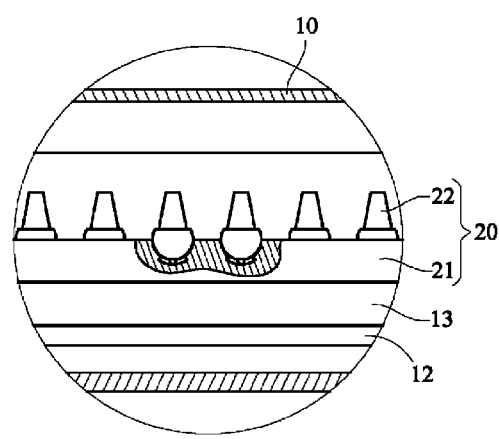
FIG. 6 is a schematic partial view of FIG. 5.

Referring to FIGS. 4, 5, and 6, when the electronic device is placed on a horizontal plane, for example, when it is placed on a desk and is not used, both the casing 10 and the thermal transfer plate 21 are parallel to the horizontal plane and perpendicular to a direction of an acceleration of gravity. At this time, the center of gravity of each of the movable thermal transfer members 22 is located at a relatively low position on the thermal transfer plate 21, that is, the movable thermal transfer member 22 is located at a position with a relatively low potential energy. In a thermal conduction phenomenon, the thermal energy is conducted from a place with a higher temperature to a place with a lower temperature, and the thermal transfer efficiency is in inverse proportion to a distance, that is, the longer the distance between two objects is, the lower the thermal conduction efficiency will be. In practice, a temperature boundary layer is formed on a surface of a high-temperature object. When a low-temperature object is located in the temperature boundary layer of the high-temperature object, the thermal energy of the high-temperature object is easily conducted to the low-temperature object. In other words, as long as the low-temperature object is not located within the temperature boundary layer of the high-temperature object, the thermal energy of the high-temperature object is not easily conducted to the low-temperature object.

Figures 7, 8:
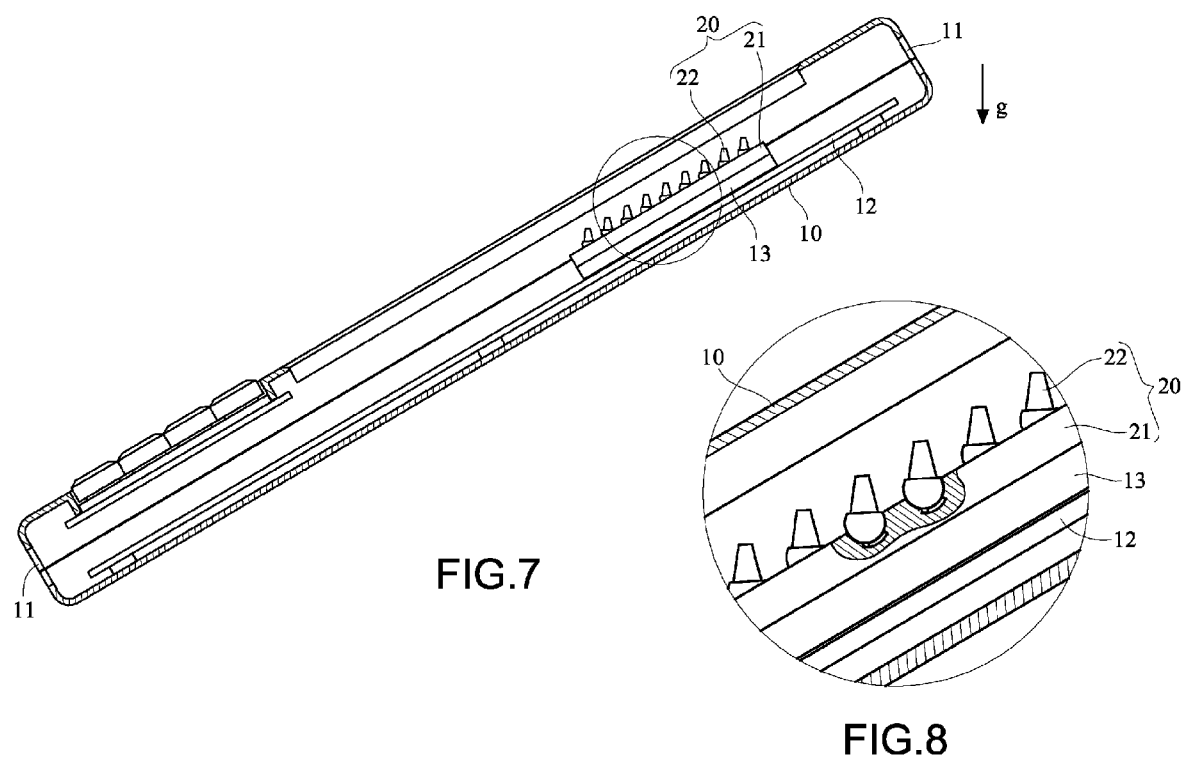
FIG. 7 is a cross-sectional view of the electronic device according to the first embodiment of the present invention, when being operated in a tilted manner.
FIG. 8 is a schematic partial view of FIG. 7.
Figure 9:
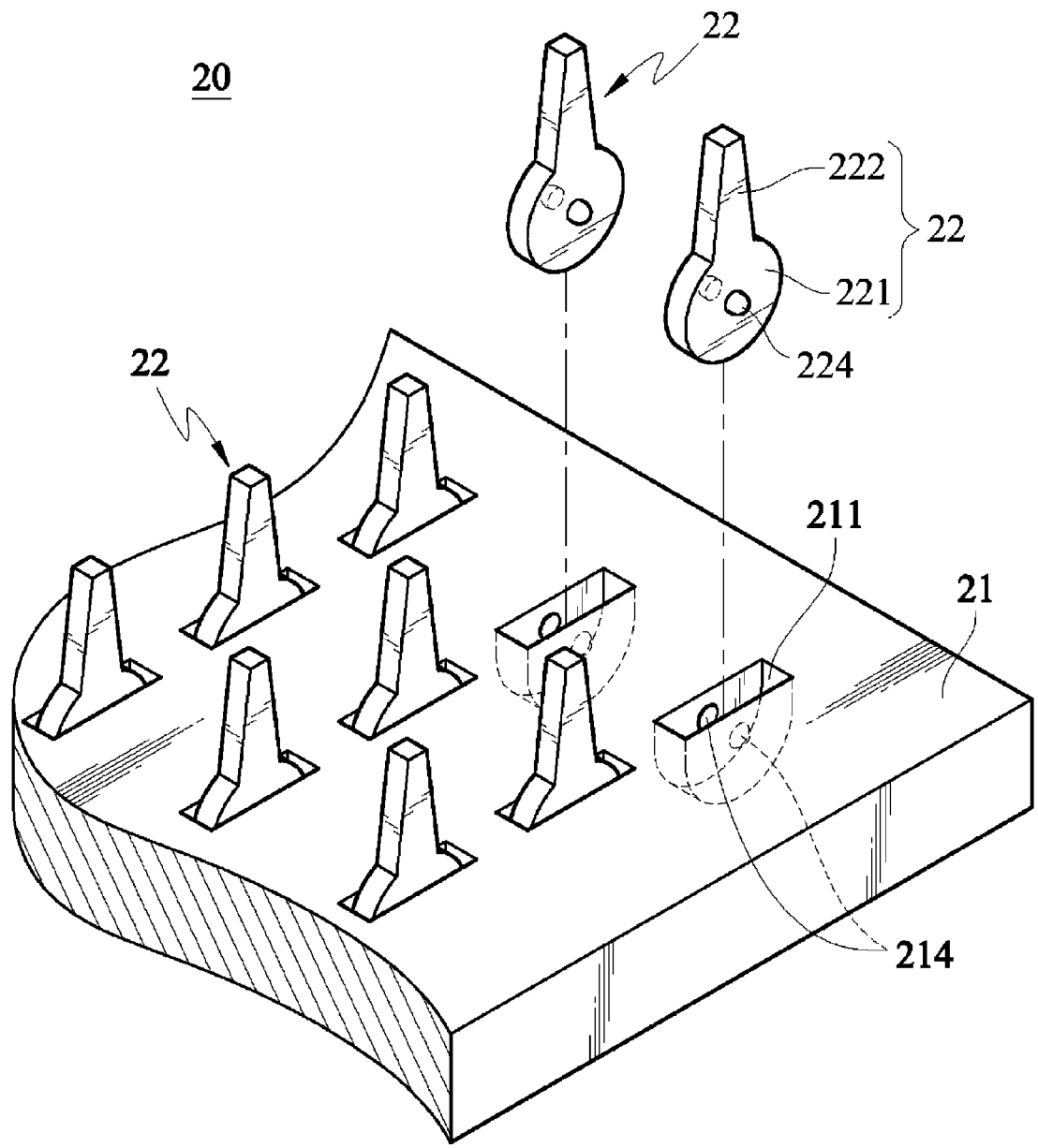
FIG. 9 is an exploded view of movable thermal transfer members and a thermal transfer plate according to a second embodiment of the present invention.
Figure 10:
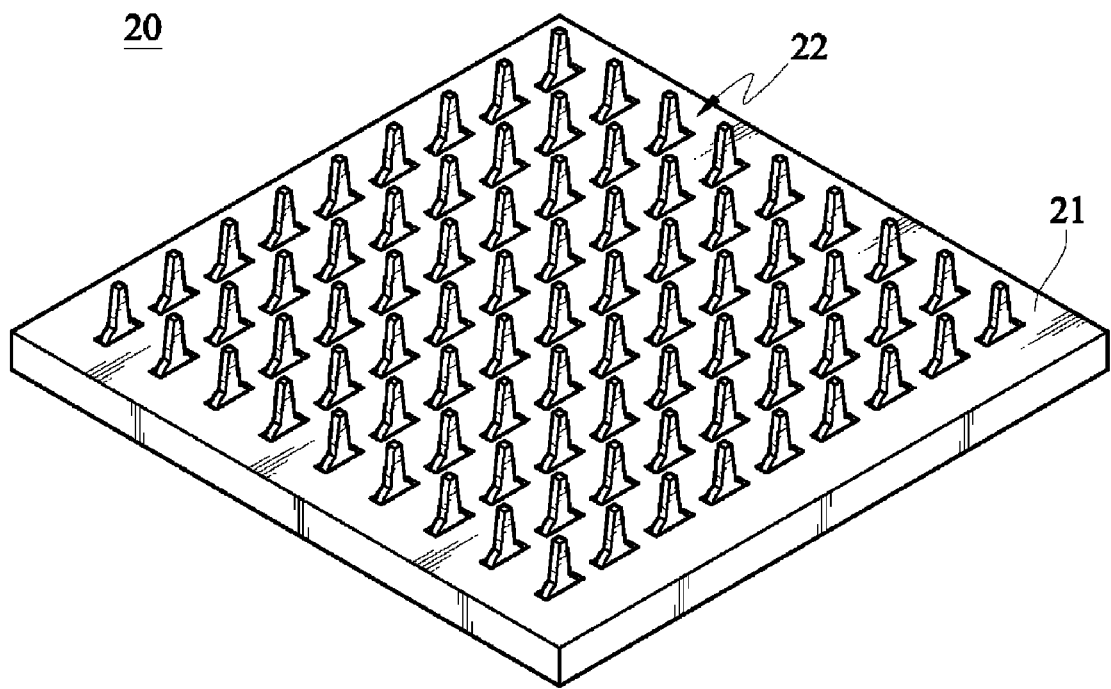
FIG. 10 is a schematic view of a heat sink according to the second embodiment of the present invention.
Figure 11:
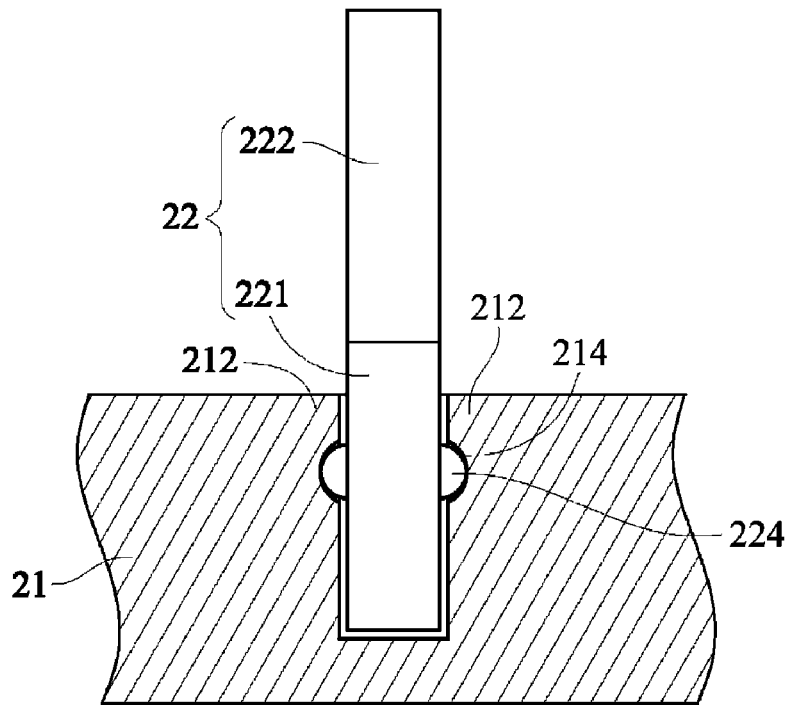
FIG. 11 is a partial cross-sectional view of the heat sink according to the second embodiment of the present invention.
Figure 12:
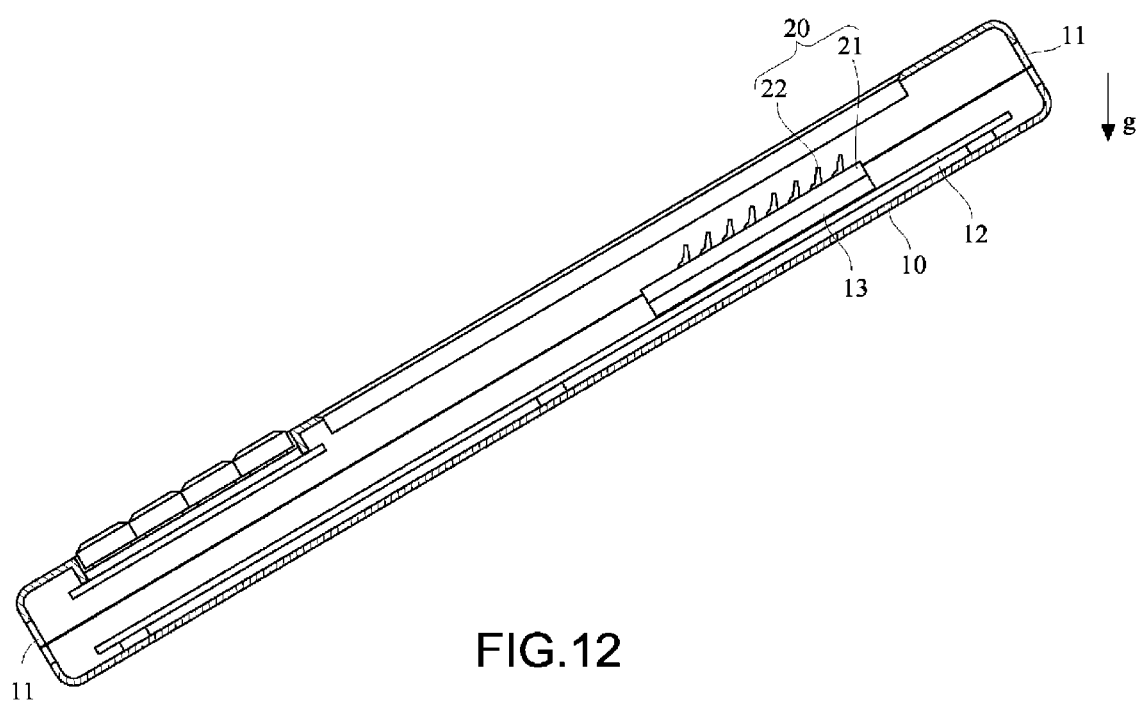
FIG. 12 is a cross-sectional view of the electronic device according to the second embodiment of the present invention, when being operated in a tilted manner.

Referring to FIGS. 7 and 8, when the user uses the electronic device while holding it with a hand, he/she tilts the casing 10 with respect to the horizontal plane for the convenience in usage, such that the casing 10 or the conducting plate 21 is tilted by a certain angle with respect to the horizontal plane. At this time, the center of gravity of each of the movable thermal transfer members 22 is relatively raised, that is, the movable thermal transfer member 22 is located at a position with a relatively high potential energy. Therefore, once the casing 10 or the thermal transfer plate 21 is tilted with respect to the horizontal plane, each of the movable thermal transfer members 22 swings relative to the thermal transfer plate 21 towards a position with the lowest potential energy, such that the free end 222 thereof points to a direction opposite to that of the acceleration of gravity under a normal state. In this way, a distance between a front end of the free end 222 and the casing 10 is prolonged relative to the distance from the casing 10 when being placed on the horizontal plane, such that the casing 10 does not fall into a temperature boundary layer of the free end 222, and the thermal energy of the free end 222 is not easily conducted to the casing 10 directly, and thus the temperature of the casing 20 is not excessively high. In addition, since each of the movable thermal transfer members 22 is parallel to the direction of the acceleration of gravity, the air at the bottom of the movable thermal transfer member 22 can flow upwards smoothly, so as to prevent the hot air around the heat sink 20 from being hindered by the movable thermal transfer member 22, thereby more smoothly bringing the air to perform the convection between an interior of the casing 10 and the outside air through the thermal dissipation holes 11.

FIGS. 9, 10, 11, and 12 show an electronic device and a heat sink thereof according to a second embodiment of the present invention. The implementation of this embodiment is similar to that of the first embodiment, but the main difference there-between lies in the configurations of the recesses 211 and the movable thermal transfer members 22. In this embodiment, each of the recesses 211 is substantially an elongate recess with two shaft holes 214 facing each other on an inner wall thereof. The weight end 221 of each of the movable thermal transfer members 22 is substantially a disc with a cam shaft 224 on each end surface thereof. Each cam shaft 224 of the disc (the weight end 221) is respectively inserted into each shaft hole 214 of the elongate recess (the recess 211), such that the movable thermal transfer member 22 may swing on the thermal transfer plate 21. The retaining portion 212 is two strip edges located at two sides of an opening of the elongate recess (the recess 211). The weight end 221 is restricted by the retaining portion 212, such that the movable thermal transfer member 22 does not fall off from the thermal transfer plate 21 during the swinging process.

The present invention achieves the following efficacies. The movable thermal transfer members may swing on the thermal transfer plate through the weight ends thereof, and the center of gravity of each of the movable thermal transfer members is located at the weight end. Therefore, the movable thermal transfer members may swing accordingly as the casing is tilted with respect to the horizontal plane, such that the free end thereof points to the direction opposite to that of the acceleration of gravity at any time, so as to increase the distance between the free end and the casing. In this way, the thermal energy on the movable thermal transfer members is not directly conducted to the casing, thereby avoiding the excessively high temperature of the casing of the electronic device, enabling the airflow around the movable thermal transfer members to flow smoothly, and improving the thermal dissipation efficiency.

What is claimed is:

1. An electronic device, comprising:
   a casing;
   a thermal generating element, disposed within the casing and operating to produce thermal energy; and
   a heat sink, comprising:
      a thermal transfer plate, contacting the thermal generating element and comprising at least one recess and at least one retaining portion; and
      at least one movable thermal transfer member, comprising a weight end and a free end, wherein the weight end is accommodated in a respective one of the at least one recess and restricted in the respective one of the at least one recess by a corresponding one of the at least one retaining portion, the thermal energy produced by the thermal generating element is conducted to each of the at least one movable thermal transfer member via the thermal transfer plate, a center of gravity of the each of the at least one movable thermal transfer member is located at the weight end thereof, and when the casing is tilted by a certain angle, the each of the at least one movable thermal transfer member swings relative to the thermal transfer plate, such that the free end of the each of the at least one movable thermal transfer member points to a direction opposite to that of an acceleration of gravity under a normal state.

2. The electronic device according to claim 1, wherein the respective one of the at least one recess has a stopper trench, the weight end has a guide portion, the guide portion slides in the stopper trench, and the each of the at least one movable thermal transfer member swings along the stopper trench.

3. The electronic device according to claim 2, wherein the casing comprises at least two thermal dissipation holes opposite to each other, and the stopper trench is disposed corresponding to the at least two thermal dissipation holes.

4. The electronic device according to claim 1, wherein the respective one of the at least one recess is a hemispherical recess, the retaining portion is an annular edge surrounding an opening of the hemispherical recess, the weight end is a sphere, and an aperture of the opening of the hemispherical recess is larger than a diameter of the sphere.

5. The electronic device according to claim 1, wherein the respective one of the at least one recess is an elongate recess with two shaft holes facing each other on an inner wall of the elongate recess, the weight end is a disc with a cam shaft on each end surface of the disc, each cam shaft is respectively inserted into each of the two shaft holes, the corresponding one of the at least one retaining portion is two strip edges located at two sides of an opening of the elongate recess.

6. The electronic device according to claim 5, wherein the casing comprises at least two thermal dissipation holes opposite to each other, and a short side of the elongate recess corresponds to each of the at least two thermal dissipation holes.

7. A heat sink, applicable for performing thermal exchange on a thermal generating element within an electronic device, wherein the thermal generating element operates to produce thermal energy, the heat sink comprising:
  a thermal transfer plate, contacting the thermal generating element and comprising a plurality of recesses and a plurality of retaining portions; and
  a plurality of movable thermal transfer members, each of the plurality of movable thermal transfer members comprising a weight end and a free end respectively, wherein the weight end of the each of the plurality of movable thermal transfer members is accommodated in a respective one of the plurality of recesses and restricted in the respective one of the plurality of recesses by a corresponding one of the plurality of retaining portions, the thermal energy produced by the thermal generating element is conducted to the each of the plurality of movable thermal transfer members via the thermal transfer plate, a center of gravity of the each of the plurality of movable thermal transfer members is located at the weight end thereof, and when the thermal transfer plate is tilted by a certain angle, the each of the plurality of movable thermal transfer members swings relative to the thermal transfer plate, such that the free end of the each of the plurality of movable thermal transfer members points to a direction opposite to that of an acceleration of gravity under a normal state.

8. The heat sink according to claim 7, wherein the respective one of the plurality of recesses has a stopper trench, the weight end has a guide portion, the guide portion slides in the stopper trench, and the each of the plurality of movable thermal transfer members swings along the stopper trench.

9. The heat sink according to claim 7, wherein the respective one of the plurality of recesses is a hemispherical recess, the corresponding one of the plurality of retaining portion is an annular edge surrounding an opening of the hemispherical recess, the weight end is a sphere, and an aperture of the opening of the hemispherical recess is larger than a diameter of the sphere.

10. The heat sink according to claim 7, wherein the respective one of the plurality of recesses is an elongate recess with two shaft holes facing each other on an inner wall of the elongate recess, the weight end is a disc with a cam shaft on each end surface of the disc, each cam shaft is respectively inserted into each of the two shaft holes, and the corresponding one of the plurality of retaining portions is two strip edges located at two sides of an opening of the elongate recess.

* * * * *